United States Patent [19]
Peck et al.

[11] Patent Number: 5,633,700
[45] Date of Patent: May 27, 1997

[54] ACTUATOR FOR ACTUATING A SURFACE CONTACTING PROBE OF A CONTACTING ELECTROSTATIC VOLTMETER

[75] Inventors: Wilbur M. Peck, Rochester; Stanley J. Wallace, Victor; Alan J. Werner, Jr., Rochester, all of N.Y.

[73] Assignee: Xerox Corporation, Stamford, Conn.

[21] Appl. No.: 331,448

[22] Filed: Oct. 31, 1994

[51] Int. Cl.⁶ .................................................. G03G 21/00
[52] U.S. Cl. .................................................. 399/73; 324/457
[58] Field of Search ......................... 355/219, 301, 355/210, 303, 216, 208; 361/221, 225, 230; 324/72, 457, 511, 522, 754; 310/248, 239, 244

[56] References Cited

U.S. PATENT DOCUMENTS

| | | | |
|---|---|---|---|
| 3,667,036 | 5/1972 | Searchman | 324/72 |
| 4,063,155 | 12/1977 | Buchheit | 324/72 X |
| 4,336,565 | 6/1982 | Murray et al. | 361/225 |
| 4,358,699 | 11/1982 | Wilsdorf | 310/251 |
| 4,415,635 | 11/1983 | Wilsdorf et al. | 310/248 X |
| 4,455,078 | 6/1984 | Mukai et al. | 355/219 X |
| 4,761,709 | 8/1988 | Ewing et al. | 361/225 |
| 4,804,922 | 2/1989 | Sometani et al. | 324/457 |
| 5,220,481 | 6/1993 | Swift et al. | 361/225 |
| 5,270,660 | 12/1993 | Werner, Jr. et al. | 324/457 |
| 5,294,962 | 3/1994 | Sato et al. | 355/219 |
| 5,323,115 | 6/1994 | Werner, Jr. | 324/457 |

OTHER PUBLICATIONS

Swift, "Electroconductive Composite Brush Fibers," Xerox Disclosure Journal, vol. 18, No. 6, (Nov./Dec. 1993) pp. 609–610.

*Primary Examiner*—Shuk Yin Lee
*Attorney, Agent, or Firm*—Duane C. Basch

[57] ABSTRACT

A contacting electrostatic voltmeter suitable for sampling positive or negative potentials on an electrostatically charged surface. The electrostatic voltmeter includes a selectively controllable actuation mechanism that enables the use of a contacting electrostatic voltmeter to sample the surface of an electrostatically charged member, moving relative thereto, within a predetermined space. The invention finds particular use in a printing system, where it enables charge monitoring during printing yet avoids disturbance to charged latent image areas on the imaging member.

16 Claims, 3 Drawing Sheets

ACTUATOR FOR ACTUATING A SURFACE CONTACTING PROBE OF A CONTACTING ELECTROSTATIC VOLTMETER

This invention relates generally to the measurement of electrostatic potentials on a surface, and more particularly to an apparatus for actuating a surface contacting probe of an electrostatic voltmeter.

CROSS REFERENCE

The following related patents are hereby incorporated by reference for their teachings:

U.S. Pat. No. 5,270,660 to Werner, Jr. et al., issued Dec. 14, 1993; and

U.S. Pat. No. 5,323,115 to Werner, Jr., issued Jun. 21, 1994.

BACKGROUND OF THE INVENTION

Generally, in the process of electrostatographic printing, an insulating member, for example a photoconductor, is charged to a substantially uniform potential to sensitize the surface thereof. The charged surface of the photoconductive insulating member is thereafter exposed to a light image of an original document to be reproduced. This records an electrostatic latent image on the photoconductive member corresponding to the information areas contained within the original document. Alternatively, in a printing application, the electrostatic latent image may be created electronically by exposure of the charged photoconductive layer by an electronically controlled laser beam emanating from a raster output scanner. After recording the electrostatic latent image on the photoconductive member, the latent image is developed by bringing a developer material charged to an opposite polarity into contact therewith. In such processes, the developer material may comprise a mixture of carrier particles and toner particles or toner particles alone. Toner parities are attracted to the electrostatic latent image to form a toner powder image which is subsequently transferred to a copy sheet or equivalent media and thereafter permanently affixed by fusing.

In reproduction machines using a drum or an endless belt type photosensitive surface, the surface can contain more than one image at one time as it moves through various processing stations. The portions of the photosensitive surface containing the projected images, referred to as image areas, are usually separated by a portion of the photosensitive surface called the interdocument space. After charging of the photosensitive surface to a suitable charge level by a scorotron, the interdocument space of the photosensitive surface is generally discharged by a suitable lamp or raster scanner to avoid attracting toner particles at the development stations.

In order to accurately monitor the charge placed upon the photosensitive surface at various times, it is necessary to employ an electrostatic voltmeter (ESV) to sense the charge potential thereon. Two types of ESVs are known; contacting and non-contacting, reflecting the manner in which a probe of the ESV senses the surface charge potential. Generally, such devices include a probe or sensor working in conjunction with an associated voltmeter assembly which receives the signals from the probe and produces an output signal. Subsequently, the output signal may be used to drive an indicator, or to control an electrostatic process as a function of the measured electrostatic potential, for example, the non-contacting electrometer amplifier system disclosed by Seachman in U.S. Pat. No. 3,667,036 (issued May 30, 1972).

Thus, the features of the present invention may be used in the printing arts and, more particularly, in an electrostatographic system to control a xerographic process. These electrostatic voltmeters, or ESVs, are particularly well suited for measuring photoreceptor surface charge, which in turn allows for the automated adjustment of machine characteristics to achieve high quality printed output. A problem with contacting ESVs, however, is that in order to sense the surface potential, they must physically contact the surface with the probe, for example a conductive brush as disclosed in U.S. Pat. No. 5,270,660 to Werner, Jr. et al. Unfortunately, such contacting-type ESVs typically interfere with any image deposited on the surface and are limited to use prior to development.

Heretofore, it has been recognized that in a contacting-type ESV, the sensing probe or electrode must contact the surface associated with the the field being measured in order to accurately measure the field.

Some contacting-type ESVs are described in the following issued patents which may be relevant:

U.S. Pat. No. 4,804,922 to Sometani et al. describes a voltage sensor used to sense voltage on an electrically charged object such as a transmission line. Although directed to a non-contacting sensor, Sometani et al. disclose contact type potential transformers that are affixed directly to the electrically charged object being measured.

U.S. Pat. No. 5,270,660 to Werner, Jr. et al., issued Dec. 14, 1993 and previously incorporated by reference, discloses a contacting-type electrostatic voltmeter wherein the charged surface is contacted by a conductive member. The conductive member is described as consisting of a pultruded brush material including carbon fibers therein, which acts as a suitable path to carry charge to the electrostatic voltmeter.

The present invention is a device capable of selectively actuating a probe of a contacting-type electrostatic voltmeter (ESV) wherein the measurement of electrostatic potentials is accomplished with insignificant current flow into the input of the ESV. Moreover the contact of the ESV is selectively actuated to occur only within the interdocument space, so as not to deplete the surface charge. The present invention overcomes the drawbacks of conventional contacting ESVs by allowing for the selective control of probe contact with the charged surface.

In accordance with the present invention, there is provided an apparatus for sensing an electrostatic potential on a surface and generating a signal representative thereof for input to an electrostatic voltmeter, comprising: an electroconductive brush formed of a plurality of conductive fibers; a brush support member adapted to support a first end of the conductive brush fibers; an electrical conductor, connected between the first end of the conductive brush fibers and the electrostatic voltmeter; and actuating means, associated with said brush support member, adapted to selectively move said brush into and out of contact with the surface.

In accordance with another aspect of the present invention, there is provided an electrostatic voltmeter for measuring an electrostatic potential on a surface, comprising: a surface contacting sensor for producing an output signal representative of the electrostatic potential on the surface, including an electroconductive brush, and actuating means associated with said brush, wherein the actuating means is adapted to selectively move said brush into and out of contact with the surface; a high-voltage source adapted to produce a first potential having a polarity the same as the electrostatic potential and a magnitude greater than that of the electrostatic potential; level shifting means, powered by said high-voltage source, for shifting the level of the output signal produced by said sensing means, so as to reference the output signal to a ground potential, and generating a first signal in response to the ground potential referenced output signal; and means, connected to receive the first signal from said level shifting means, for converting the first signal to a low voltage signal, wherein the low voltage signal is referenced to ground potential and where the magnitude of the deviation of the low voltage signal from ground potential is a measure of the magnitude of the electrostatic potential.

The present invention will be described in connection with preferred embodiments, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
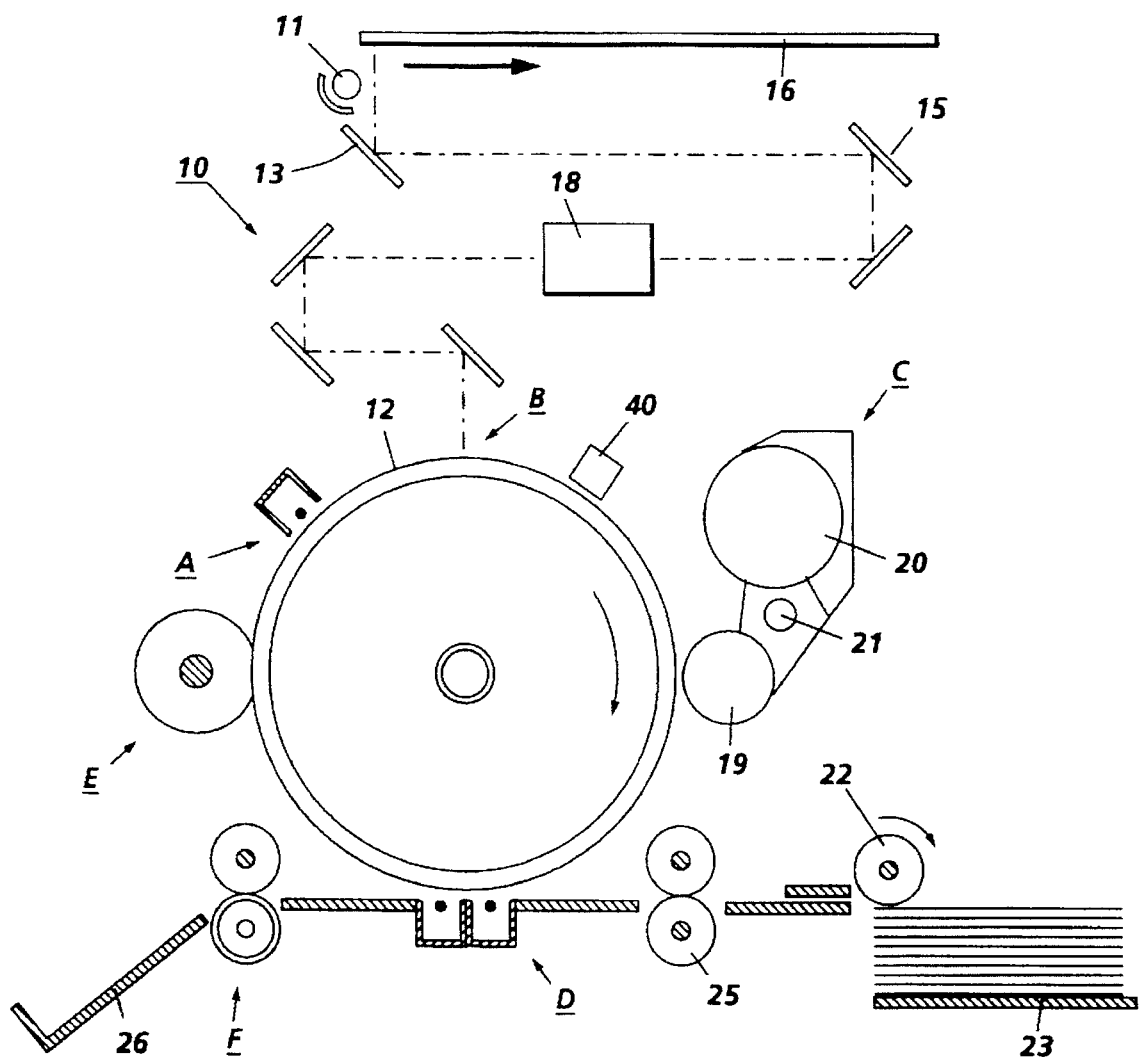
FIG. 1 is a schematic representation of a printing machine which can utilize the present invention.

For a general understanding of the electrostatic voltmeter of the present invention, reference is made to the drawings. In the drawings, like alphanumeric reference characters have been used throughout to designate identical elements. Referring now to FIG. 1, there is shown an automatic xerographic printing machine 10 including a developer assembly which has a removable developer storage and dispensing cartridge 20. As used herein, the term "developer" is intended to define all mixtures of toner and carrier as well as toner or carrier alone. The printer includes a photosensitive member 12, which may be a rigid rum or flexible photoreceptor, and which is rotated in the direction indicated by the arrow to pass sequentially through a series of xerographic processing stations; charging station A, imaging station B, developer station C, transfer station D, and cleaning station E.

A document to be reproduced is placed on imaging platen 16 and is scanned by a moving optical system including a lamp 11 and mirrors 13 and 15 and stationary lens 18 to produce a flowing light image on the drum surface which has been charged at charging station A. The flowing light image on the drum surface at station B produces a latent image corresponding to the scanned document. The latent image is then developed at development station C to form a visible toner image. The development station C includes a developer roll 19 which may, for example, provide a magnetic brush of developer to the drum 12 which is supplied with developer from a developer hopper 20 by, for example, an auger 21. The top sheet 23 in a supply of cut sheets is fed by feed roll 22 to registration rolls 25 in synchronous relationship with the image on the drum surface, to the transfer station D. Following transfer of the toner image to the copy sheet, the copy sheet is stripped from the drum surface and directed to the fusing station F to fuse the toner image on the copy sheet after which the drum surface itself continues to cleaning station E where residual toner remaining on the drum surface is removed prior to the drum surface again being charged at charging station A. Upon leaving the fuser, the copy sheet with the fixed toner image thereon is transported to sheet collecting tray 26.

Figure 2:
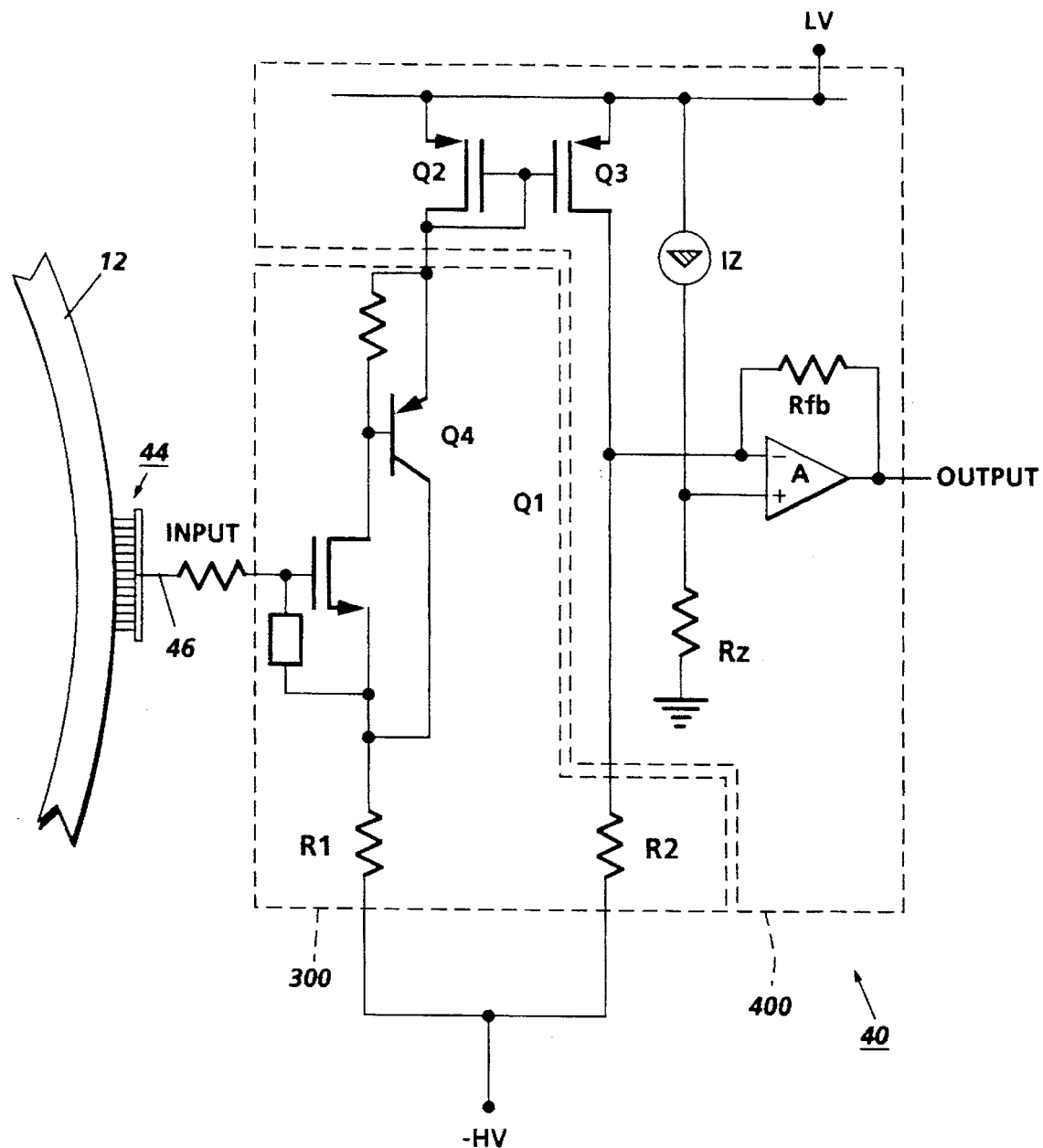
FIG. 2 is an electrical schematic showing the circuitry associated with a contacting electrostatic voltmeter which can employ the present invention.

Voltage measuring device 40 is preferably a contacting electrostatic voltmeter. Referring to FIG. 2, which illustrates the details of a contacting electrostatic voltmeter 40, insulating surface 12 is contacted by a conductive member 44. Ideally, conductive member 44 is capable of coupling with the electrostatic potential present on surface 12 without depleting the potential or redistributing any pattern of charge present thereon. In a preferred embodiment, member 44 is a brush suitable for the transfer of charge along the fibers thereof, similar to that described by Swift et al. in U.S. Pat. No. 5,220,481 (issued Jun. 15, 1993), by Swift in "Electroconductive Composite Brush Fibers," Xerox Disclosure Journal, Vol. 18, No. 6, (Nov./Dec. 1993) pp. 609–10, by Sato et al. in U.S. Pat. No. 5,294,962 (issued Mar. 15, 1994), or by Murray et al. in U.S. Pat. No. 4,336,565 (issued Jun. 22, 1982), the relevant portions of each being hereby incorporated by reference. As disclosed by Swift et al. the carbon fibers within the brush, originally formed as a pultruded composite including fine diameter polyacrylonitrile-based carbon fibers, act as a suitable path for the charge contacted by the brush on surface 12. Other equivalent charge conducting materials may be employed for conductive member 44, including the conductive particle impregnated strandlined "cloth" described by Mukai et al. in U.S. Pat. No. 4,455,078 (issued Jun. 19, 1984), or the brush materials disclosed by Wilsdorf in U.S. Pat. No. 4,358,699 (issued Nov. 9, 1982), and Ewing et al. in U.S. Pat. No. 4,761,709 (issued Aug. 2, 1988), the portions of each patent related to electrically conductive materials being hereby incorporated by reference.

It should also be noted that means other than a pultrusion may be used to fabricate a suitable brush-like contact. Generally, ends of the fibers would be combined at a common brush support location or member that is electrically coupled to connection 46, and which forms the input to contacting electrostatic voltmeter 40. When the carbon fibers of the brush are insulated from one another, as disclosed by Swift et al., the effective parallel fiber contact exhibits a high electrical resistance, typically above $5 \times 10^8$ $\Omega$-cm, and there is no redistribution, or smearing, of the latent image. However, when there is no concern for redistribution of the charge on the photoconductive surface, for example, within the interdocument space, a lower resistance brush contact, without insulated fibers, would be preferred.

In general, the ESV generates a low voltage electrical output in response to an electric signal provided by conductive member 44 which is exposed to an electrostatic potential present on the surface. The ESV preferably comprises two primary elements, or blocks, in addition to the conductive member. High-voltage level shifting circuit 300 is connected to the sensor to produce a current signal referenced to ground potential. The magnitude of the current signal is a measure of the surface potential. Subsequently, the current signal is passed to converter 400 to be converted to the low voltage electrical output signal.

More specifically, FIG. 2 shows a simplified electrical circuit that is employed in the contacting ESV. NMOS FET Q1 is a high-voltage depletion-mode NMOS driver which operates in the range of from about 0 volts to at least −1700 volts. Also included with the NMOS FET is protection device 21 which is capable of withstanding an electrostatic discharge voltage of approximately 2 KV. In one embodiment, high-voltage resistors R1 and R2 are 7.69 M$\Omega$ resistors which are capable of operating over a voltage range of at least 0 to −1200 volts. Furthermore, R1 and R2 are purposefully designed to track one another over the range of ESV operating temperatures. Generally, the high-voltage resistors may be thin-film integrated circuit resistors.

In operation, a high voltage in the range of about −1200 volts is detected by conductive member 44 and supplied to the circuit of FIG. 2 via input line 46. NMOS FET Q1, in conjunction with high-voltage resistor R1, forms a source-follower which serves as the level shifting component 300, where the current through the source-follower is a measure of the voltage difference between the gate of Q1 (or input voltage) and the high-voltage power supply potential, −HV. Also shown is a high-voltage PNP transistor, Q4, which is capable of operating over a range of from about 0 volts to at least −1250 volts, although typically at potentials of approximately −1200 volts. The fabrication of a high-voltage transistor similar to Q4 is described in U.S. patent application Ser. No. 07/722,736 by Vo et al., filed Jun. 27, 1991 (now abandoned). In the contacting type ESV, high voltage PNP transistor Q4 enables the use of a compound Darlington amplifier comprising transistors Q1 and Q4. The high common emitter current gain ($\beta \approx 100$) of Q4, effectively bootstraps the source of Q1 so that the voltage change across the gate-to-source of the high-voltage NMOS FET, Q1, is minimized, thereby minimizing the effective input capacitance of the ESV circuit illustrated in FIG. 2.

The high-voltage power supply, represented by −HV, may be any suitable power supply capable of providing a potential somewhat more negative than the most negative voltage being measured but within the device ratings, about −1700 volts, although the device is preferably operated to measure voltages of about −1200 volts. The maximum current required from the high-voltage power supply is determined by the parallel resistance of R1 and R2 and is less than 500 μA for the typical operating range.

Matched transistors Q2 and Q3 form a 1:1 current mirror, where the current from transistor Q3, $i_1$, tracks the current in transistor Q2, which in turn is the current from NMOS FET Q1. At the same time current $i_2$, in high-voltage resistor R2, is a measure of the high-voltage power supply. Therefore, the difference between the current from resistor R2 and from transistor Q3, or $i_1-i_2$, is an accurate measure of the input voltage on line 46. Since this difference current ($i_1-i_2$) is supplied by amplifier A via resistor $R_{fb}$, the output of amplifier A is also a measure of the input voltage. Thus, the NMOS FET Q1 and current mirror system Q2–Q3 translate the high voltage input to a low voltage output at ground potential, while maintaining the very high input impedance required by ESVs and without any need for a low-voltage power supply floating at a voltage approximately equal to the electrostatic potential being measured.

By making the R1, R2, and $P_{fb}$ resistor ratios track very tightly over the operating temperature range for the circuit, approximately 0° C. to 50° C., the voltage output by amplifier A on the output line accurately and reliably traces that of the input voltage present on input line 46 over that range. The basic circuit illustrated in FIG. 2 also includes a zeroing circuit represented by current lz flowing through resistor Rz, thus shifting the output range off zero. Note that as with resistor $R_{fb}$, the response of resistor Rz to temperature changes must closely track the responses of high-voltage resistors R1 and R2. In addition, it is preferable to fabricate R1, R2, Rz and $R_{fb}$ on the same high-voltage integrated circuit. Alternatively, an external matched network of either thick or thin film resistors could be used. Although not specifically illustrated, it is to be understood that the circuit of FIG. 2 may be modified to produce a positive voltage sensing ESV.

In order to measure the electrostatic potential on surface 12 only during the interdocument spacing, and avoid disturbing electrostatic latent or developed image areas on surface 12, it is necessary to selectively actuate conductive member 44 so as to cause it to contact surface 12 only when the interdocument space lies below the member. Referring to FIGS. 3 through 6, four possible electro-mechanical embodiments of the actuating mechanism for conductive member 44 are depicted therein.

Figure 3:
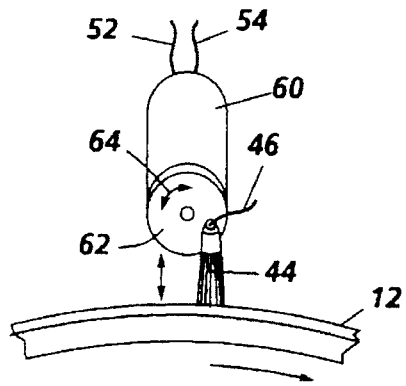
FIGS. 3 through 6 are illustrations of various electromechanical embodiments suitable for actuating the ESV probe in accordance with the present invention.

FIG. 3 illustrates an actuating mechanism including a rotary solenoid 60 which is energized, via electrical signals provided on wires 52 and 54, to rotate a disc 62 in either a forward or reverse direction as indicated by arrow 64. Rotary solenoid 60 is preferably a rotary solenoid suitable for moving the load imparted by conductive member 44 in a manner so as to contact the surface within an interdocument space and avoid contacting any toner images developed on surface 12. The electrical signals used to actuate the solenoid would be produced under the control of a microcontroller (not shown) so as to synchronize the contact of conductive member 44 with the surface during the interdocument space or at other suitable times. Such a microcontroller may also be used for sampling of the ESV output during the period where the conductive member is in contact with the interdocument space. Attached at a point spaced radially from the center of disc 62 is a brush-like conductive member 44 which contacts surface 12 when driven in a first direction by solenoid 60 and is removed from contact with the surface when the solenoid is driven in the opposite direction. Equivalent motion may be accomplished by replacing disc 62 with an arm extending from the pivoting axle at the center of the solenoid, or using a cam-like arrangement, wherein the cam is driven by a rotating motor such as a motor in synchronization with the movement of surface 12.

Figure 4:
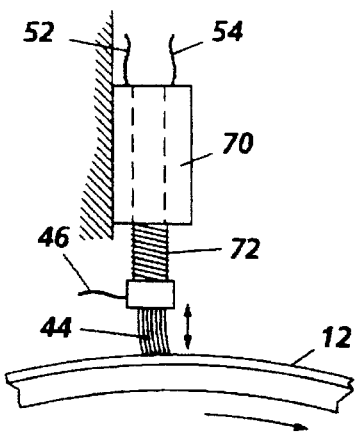

Alternatively, as depicted in FIG. 4, a linear solenoid 70 may be employed to selectively actuate the conductive member 44 placing it in contact with surface 12 and subsequently removing it therefrom. Linear solenoid 70 is preferably suitable for moving the load imparted by conductive member 44 in a manner so as to avoid contacting any toner images developed on surface 12, and having an extendible member 72 protruding therefrom. As previously described, the electrical signals applied to solenoid 70 would synchronize the actuation of conductive member 44 with the interdocument space on surface 12. Alternatively, linear solenoid 70 may be a pneumatic device operating under the control of fluid pressure changes in response to a controller (not shown) as described above.

Figure 5:
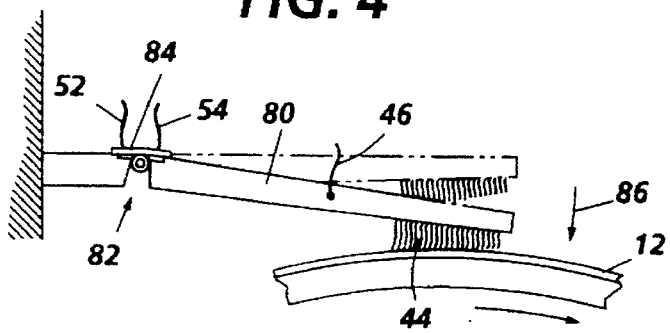
Figure 6:
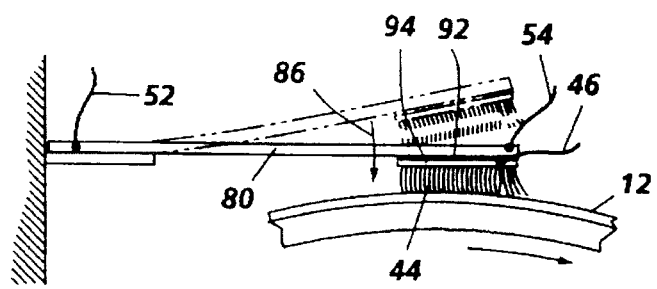

FIGS. 5 and 6 illustrate specific embodiments of an actuating mechanism wherein conductive member 44 is held at the end of a pivoting or cantilever arm 80, respectively. In the embodiment depicted in FIG. 5, the motion of arm 80 about a pivoting point 82 is regulated by a piezoelectric thin film 84. Piezoelectric film 84 may be any film suitable to force suspended arm 80 toward the surface, in the direction of arrow 86, as the result of a physical expansion of the film in response to electrical signals on lines 52 and 54. Piezoelectric film 84 is preferably suitable for moving the load imparted by conductive member 44 and arm 80 in a manner so as to avoid contacting any toner images developed on surface 12. In a similar embodiment depicted in FIG. 6, cantilever arm 80 is formed from a shaped memory material which generates an internal bending moment in response to an electrical signal applied along a length of the material. For example, the material Nitinol®, a nickel-zicanium alloy may be used to induce the arm to straighten under the application of electrical current, forcing the conductive member on the end of the arm into contact with surface 12. As with the electromechanical systems described in FIGS. 3 and 4, the electrically responsive materials of FIGS. 5 and 6 would have signals controlled via a microcontroller or equivalent device so as to cause actuation. Furthermore, as illustrated in FIG. 6, the application of the actuation signals to arm 80 would require the electrical isolation of conductive member 44 therefrom. To achieve such isolation, an insulating layer 92 would be interposed between the conductive brush support layer 94 of member 44 and arm 80. Moreover, conductive layer 94 may improve the ease with which input line 46 is attached to the conductive member.

In recapitulation, the present invention is a contacting electrostatic voltmeter suitable for sampling positive or negative potentials on an electrostatically charged surface. A selectively controllable actuation mechanism enables the use of a contacting electrostatic voltmeter to sample the surface of an electrostatically charged imaging member within an interdocument space. The invention finds particular use in a printing system, where it enables charge monitoring during printing yet avoids disturbance to the charged latent image areas on the imaging member.

It is, therefore, apparent that there has been provided, in accordance with the present invention, an apparatus for efficiently and reliably sampling a signal representative of the potential of an electrostatic field on an insulating surface during an interdocument space. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. An apparatus for sensing an electrostatic potential on a surface and generating a signal representative thereof for input to an electrostatic voltmeter, comprising:

an electroconductive brush formed of a plurality of conductive fibers;

a brush support member supporting a first end of the conductive brush fibers;

an electrical conductor, connected between the first end of the conductive brush fibers and the electrostatic voltmeter; and actuating means, associated with said brush support member, for selectively moving said electroconductive brush into and out of contact with the surface.

2. The apparatus of claim 1 wherein said actuating means comprises:

a rotary solenoid having a rotatable axle;

means for attaching said electroconductive brush to the axle so as to maintain the electroconductive brush in a spaced relationship with the axle; and a microcontroller for controlling said rotary solenoid so as to selectively cause the electroconductive brush to contact the surface.

3. The apparatus of claim 1 wherein said actuating means comprises:

a linear solenoid having an extendible member therein;

means for attaching said electroconductive brush to the extendible member; and a microcontroller for controlling said linear solenoid so as to selectively cause the electroconductive brush to contact the surface.

4. The apparatus of claim 1 wherein said actuating means comprises:

an arm having first end pivotally attached to a rigid support and a second end upon which said electroconductive brush is attached;

a piezoelectric member, affixed between said arm and the rigid support so as to cause a deflection of said arm in a direction toward the surface in response to an electrical signal; and a microcontroller for controlling the electrical signal applied to said piezoelectric member so as to cause the electroconductive brush to selectively contact the surface.

5. The apparatus of claim 1 wherein said actuating means comprises:

a cantilever arm having first end attached to a rigid support and a second end upon which said electroconductive brush is attached, said cantilever arm being formed from a material that generates an internal bending moment along a length of said arm in response to an electrical signal applied thereto, wherein the generation of said bending moment results in a deflection of the cantilever arm so as to cause said electroconductive brush to contact the surface;

a microcontroller for controlling the electrical signal applied to said cantilever arm so as to cause the electroconductive brush to selectively contact the surface.

6. The apparatus of claim 5, wherein the cantilever arm is formed from a shaped memory material.

7. The apparatus of claim 6, wherein the shaped memory material is Nitinol, a nickel-titanium alloy.

8. An electrostatic voltmeter apparatus for measuring an electrostatic potential on a surface, comprising:

a surface contacting sensor for producing an output signal representative of the electrostatic potential on the surface, including an electroconductive brush and actuating means associated with said brush, wherein the actuating means selectively moves said brush into and out of contact with the surface;

a high-voltage source, said high-voltage source producing a first potential having a polarity the same as the electrostatic potential and a magnitude greater than that of the electrostatic potential;

level shifting means, powered by said high-voltage source, for shifting a level of the output signal produced by said surface contacting sensor, so as to reference the output signal to a ground potential, and generating a first signal in response to the ground potential referenced output signal; and means, connected to receive the first signal from said level shifting means, for converting the first signal to a low voltage signal, wherein the low voltage signal is referenced to ground potential and where a magnitude of a deviation of the low voltage signal from ground potential is a measure of the electrostatic potential.

9. The apparatus of claim 8 wherein said actuating means comprises:

a rotary solenoid having a rotatable axle;

means for attaching said electroconductive brush to the axle so as to maintain the electroconductive brush in a spaced relationship with the axle; and a microcontroller for controlling said rotary solenoid so as to selectively cause the brush to contact the surface.

10. The apparatus of claim 8 wherein said actuating means comprises:

a linear solenoid having an extendible member therein;

means for attaching said electroconductive brush to the extendible member; and a microcontroller for controlling said linear solenoid so as to selectively cause the brush to contact the surface.

11. The apparatus of claim 8 wherein said actuating means comprises:

an arm having first end pivotally attached to a rigid support and a second end upon which said electroconductive brush is attached;

a piezoelectric member, affixed between said arm and the rigid support so as to cause a deflection of said arm in a direction toward the surface in response to an electrical signal; and a microcontroller for controlling the electrical signal applied to said piezoelectric member so as to cause the brush to selectively contact the surface.

12. The apparatus of claim 9 wherein said actuating means comprises:

a cantilever arm having first end attached to a rigid support and a second end upon which said electroconductive brush is attached, said cantilever arm being formed from a material that generates an internal bending moment along a length of said arm in response to an electrical signal applied thereto, wherein the generation of said bending moment results in a deflection of the cantilever arm so as to cause said electroconductive brush to contact the surface;

a microcontroller for controlling the electrical signal applied to said cantilever arm so as to cause the brush to selectively contact the surface.

13. The apparatus of claim 12, wherein the cantilever arm is formed from a shaped memory material.

14. The apparatus of claim 13, wherein the shaped memory material is Nitinol, a nickel-titanium alloy.

15. A xerographic printing machine comprising:

a photosensitive member including a surface thereof rotating in a first direction through a charging station for depositing an electrostatic potential thereon, an imaging station for selectively exposing regions of the surface to produce latent electrostatic images thereon, where the latent electrostatic images are separated by an interdocument space, a developer station for depositing a marking material on the latent electrostatic image, a transfer station for transferring the deposited marking material to a substrate, and a cleaning station for removing marking material remaining on the surface after transfer; and an electrostatic voltmeter, disposed at a location adjacent the surface of the photosensitive member subsequent to the imaging station along the first direction of rotation of the photosensitive member, for sensing an electrostatic potential on a surface and generating a signal representative thereof for input to the electrostatic voltmeter, including an electroconductive brush formed of a plurality of conductive fibers, a brush support member for supporting a first end of the conductive brush fibers, an electrical conductor, connected between the first end of the conductive brush fibers and the electrostatic voltmeter, and actuating means, associated with said brush support member, for selectively moving said electroconductive brush into and out of contact with the surface.

16. The xerographic printing machine of claim 15, wherein said actuating means selectively moves said electroconductive brush so as to cause contact with the surface only within the interdocument space as the surface of said photosensitive member moves relative to said electrostatic voltmeter.

* * * * *